United States Patent [19]

Sugano et al.

[11] Patent Number: 4,469,527
[45] Date of Patent: Sep. 4, 1984

[54] METHOD OF MAKING SEMICONDUCTOR MOSFET DEVICE BY BOMBARDING WITH RADIATION FOLLOWED BY BEAM-ANNEALING

[75] Inventors: Takuo Sugano; Ho Q. Vu, both of Tokyo, Japan

[73] Assignee: Tokyo University, Tokyo, Japan

[21] Appl. No.: 326,253

[22] Filed: Dec. 1, 1981

[30] Foreign Application Priority Data

Jun. 19, 1981 [JP] Japan .................................. 56-93735

[51] Int. Cl.³ ..................... H01L 21/263; H01L 21/26
[52] U.S. Cl. .................................... 148/15; 29/576 B; 29/571; 148/187; 357/91
[58] Field of Search ............... 148/1.5, 187; 29/576 B, 29/571; 357/91

[56] References Cited

U.S. PATENT DOCUMENTS

| 3,733,222 | 5/1973 | Schiller | 148/1.5 |
| 3,967,982 | 7/1976 | Arndt et al. | 148/1.5 |
| 4,025,365 | 5/1977 | Martin et al. | 148/1.5 |
| 4,147,564 | 4/1979 | Magee et al. | 148/1.5 |
| 4,187,126 | 2/1980 | Radd et al. | 148/1.5 |
| 4,278,475 | 7/1981 | Bartko et al. | 148/1.5 |

FOREIGN PATENT DOCUMENTS 0150239 11/1980 Japan .

OTHER PUBLICATIONS

Prussin et al., J. Electrochem. Soc., 125, (1978), 350.
Hodgson, IBM-TDB, 23, (1980), 373.
Petersen, IBM-TDB, 22, (1979), 2080.
Tsu et al., Phys. Rev. Letts., 42, (1979), 1356.
Mirianashvili et al., Sov. Phys.-Semiconductors, 4, (1971), 1612-15.
Kuchar et al., Phys. Stat. Solidi, 24a, (1974), 513.
Mäenpää et al., Thin Solid Films, 67, (1980), 293.
Fowler et al., IBM-TDB, 24, (1981), 1090.

Primary Examiner—Upendra Roy
Attorney, Agent, or Firm—Sughrue, Mion, Zinn, Macpeak and Seas

[57] ABSTRACT

A semiconductor substrate is formed by irradiating a semiconductor substrate with radioactive ray so as to generate lattice defects therein for making the entire substrate semi-insulating and then rendering only the surface of the thus irradiated substrate semiconductive, so that a semiconductor device is produced by using the substrate thus formed.

10 Claims, 38 Drawing Figures

Drive in (1,100°C, 20 min.)

FIG. 9B

Thermal Neutron Beam Irradiation

FIG. 9C

Electron Wax Coating

FIG. 9D

Silicon Etching & Laser Annealing

FIG.15B Thermal Neutron Beam Irradiation

FIG.15C Pulse Laser Annealing

FIG.15D

FIG.15E Etching

FIG.15F

FIG_16

FIG_17

$V_{Th}=-6V$; $V$: $10\mu A/diV$;
$H$: $1V/diV$; $1V/Step$

FIG. 21

$V_{Th} = -7V; V: 10\mu A/div;$
$H: 1V/div; 1V/Step$

FIG. 22

$V_{Th} = -5(V), V: 10\mu A/div;$
$H: 1V/div; 1V/Step$

FIG. 23

METHOD OF MAKING SEMICONDUCTOR MOSFET DEVICE BY BOMBARDING WITH RADIATION FOLLOWED BY BEAM-ANNEALING

BACKGROUND OF THE INVENTION

1. Field of the Invention

This invention relates to a method of producing a semiconductor device having a small electrostatic capacitance relative to the ground and a short delay time realized by such small capacitance to the ground, so that the operating frequency band width of the device is broadened and the operating speed of the device is increased. In the method of the invention, a semi-insulating semiconductor substrate is formed by generating crystal lattice defects therein through irradiation, and the semiconductor device is produced by using the surface part which is made semiconductive, of the thus formed substrate.

2. Description of the Prior Art

To broaden the operating frequency band width of a semiconductor device such as a transistor and an integrated circuit and to increase its operating speed, the propagating time of carriers in the semiconductor device should be minimized by reducing the dimension thereof, and furthermore it is very important to suppress the delay time due to the electrostatic capacitance of the semiconductor device relative to the earth.

To this end, in the case of using silicon semiconductor, it has been tried to form the substrate in the form of SOS (silicon on sapphire) structure, SIMOX (separation by IM plated oxygen) structure, graphoepitaxial structure, or gold-diffused silicon substrate. In the case of using a compound semiconductor, the semiconductor device structure is formed by making the substrate semi-insulating by adding an impurity at a high concentration and producing an epitaxial layer on that substrate, which epitaxial layer has a specific resistance of similar magnitude to that of a regular semiconductor.

The aforesaid SOS structure, which uses epitaxial growth of a silicon layer on a sapphire substrate, has shortcomings in that stress is caused in the silicon layer due to the fact that the crystal lattice of sapphire does not match with the lattice of silicon and in that the sapphire substrate is costly. Thus, the SOS structure has problems in the techniques for manufacture thereof and the cost thereof.

The SIMOX structure, which uses the growth of a silicon oxide ($SiO_2$) film in a silicon substrate by implanting oxygen into the silicon substrate at a high concentration and then annealing at a high temperature, has shortcomings in that the surface of the silicon substrate is susceptible to comparatively large damage, so that it is necessary to grow an additional epitaxial layer on the surface thereof. Thus, the SIMOX structure has drawbacks in its complicated manufacturing process, the need to implant a large amount of ions which requires a long working time, and its high cost.

The graphoepitaxial structure, which uses the growth of a single crystal silicon layer by forming fine grooves on a glass substrate, producing a polycrystal silicon layer while using said grooves as seed crystals, and converting it into the single crystal silicon layer by light or short thermal annealing, has shortcoming in that the coefficient of thermal expansion of the silicon layer is different from that of the substrate.

The gold-diffused silicon substrate structure, which uses diffusion of gold in silicon to increase the resistivity of silicon and ion implantation therein for producing an active surface layer, has shortcoming in that the diffused gold tends to introduce contamination during the formation of a semiconductor device.

In the case of compound semiconductor such as gallium arsenide (GaAs), a large amount of chromium or the like is introduced into a substrate for rendering the substrate semi-insulating, resulting in a shortcoming in that the presence of such chromium or the like tends to introduce contamination during formation of an active layer on the substrate by epitaxial growth.

SUMMARY OF THE INVENTION

Therefore, an object of the present invention is to obviate the aforesaid difficulties and shortcomings of the prior art, by providing an improved method of producing a semiconductor device. The method of the invention reduces the electrostatic capacitance of the semiconductor device relative to ground to shorten the delay time due to the electrostatic capacitance, whereby the operative frequency band width is broadened and the operating speed is increased.

To fulfill the aforesaid object, the method of producing a semiconductor device according to the invention is characterized in that a semiconductor substrate is irradiated to generate crystal lattice defects therein so as to make the entire semiconductor substrate semi-insulating and then only the surface of the thus irradiated member is rendered semiconductive so as to form a semiconductor part, whereby the semiconductor device is produced.

In the method of the invention, the semiconductor device is fabricated in a semiconductive layer which is formed at the surface of the semi-insulating substrate produced by irradiation, so that no junction capacitance is produced at the PN junction as in the case of SOS and the capacitance relative to the earth is reduced.

Starting semiconductor material to be used in the method of the present invention can be a high purity silicon substrate which has been used commonly in the industry. Although the inventors used dislocation-free FZ (floating zone) silicon substrates of 140 to 300 μm thickness in experiments, various other substrates, such as the regular silicon substrates or compound semiconductor substrates like those of gallium arsenide (GaAs) or indium phosphide (InP), can be also used. The above-mentioned FZ silicon substrate refers to that produced by the floating zone method.

Upon irradiation of thermal neutron beam onto such a semiconductor member, a large amount of lattice defects are generated. Studies of the lattice defects by the electron spin resonance (ESR) method showed that the defects are likely to be complicated silicon vacancies. Irradiation of such as a thermal neutron beam introduces deep trap levels, as confirmed by the DLTS method, so that the entire semiconductor member is made semi-insulating. To generate such lattice defects, various typed of irradiation other than the thermal neutron beam can be used, such as high-speed neutron beam, α-ray, β-ray, γ-ray, electron beam, or the like.

To provide a semiconductive layer at the surface of the thus produced semi-insulating substrate, a first embodiment of the present invention irradiates laser beam, electron beam, or ion beam onto the surface of the substrate. Whereby, that portion of the semi-insulating substrate which is just below the irradiated surface is annealed so as to extinguish the lattice defects in said portion. It should be noted that the temperature of the semi-insulating substrate must be kept below 600° C., because if the substrate is heated to a too high temperature during the process, the lattice defects of the entire substrate will be extinguished and the semi-insulating properties thereof will be lost.

Instead of the above-mentioned provision of the semiconductive layer through annealing by laser beam, electron beam, or ion beam, one may grow or deposit a similar semiconductive layer on the surface of the semi-insulating member by vacuum evaporation, chemical vapour deposition (CVD), molecular ray deposition, plasma deposition, or the like.

As an embodiment of the invention, a metal oxide silicon field-effect transistor (MOSFET) was prepared by the use of the semiconductor layer thus obtained. The semiconductor device to be produced by the method of the present invention is not limited to the MOSFET alone, and the method of the invention is suitable for producing various other semiconductor devices, integrated circuit semiconductor elements, or discrete electronic parts, such as bipolar transistors, diodes, resistors, capacitors, inductance elements, and the like.

BRIEF DESCRIPTION OF THE DRAWINGS

For a better understanding of the invention, reference is made to the accompanying drawings, in which.

DESCRIPTION OF THE PREFERRED EMBODIMENTS

In a preferred embodiment of the invention, a new substrate structure is produced by using nuclear transformation through irradiation of thermal neutrons and laser annealing. The reasons for using thermal neutrons in the preferred embodiment are in that, firstly, the irradiation of thermal neutrons causes nuclear transformation in a silicon substrate so as to facilitate spatially homogeneous introduction of a desired amount phosphorus therein, and secondly, the substrate thus treated allows formation of an n type silicon layer on the surface thereof by laser annealing. More particularly, the irradiation of thermal neutrons causes the following (n, $\gamma$) reaction in the silicon substrate to transform a part of silicon (Si) into phosphorus (P), as given by the following equation.

In the nuclear reaction of the equation (1), the capture cross section for the thermal neutron $\sigma_c$ is for instance 0.11 barn and the half value period of the beta-decay is for instance 2.62 hours. The density of the phosphorus thus produced can be given by $$[3/p] = [30_{Si}]\sigma_c \phi_{th} \cdot t = 1.7 \times 10^4 \phi_{th} \cdot t [cm^3] \quad (2)$$

The semi-insulating substrate prepared by the above-mentioned method of the invention has the following advantages.

(1) To be free from contamination by impurities, as compared with such a semi-insulating substrate which is made by adding gold or other impurities.
(2) To be easy to control the density of necessary impurities.
(3) To suit mass production.

The lattice defects thus produced by irradiation can be removed by annealing or by heating at a high temperature, so that it is possible to form a semiconductive layer on the surface of the semi-insulating substrate by annealing or raising the temperature of only such surface of the substrate, for instance by using light beams, electron beams, or ion beams. In the process of forming the semiconductive layer at the surface of the semi-insulating semiconductor substrate, the temperature of the process must be kept below 600° C. If the temperature of the process is 600° C. or higher, the entire lattice defects of the substrate are annealed, so that the entire lattice defects of the substrate extinct and the substrate loses the semi-insulating property thereof.

A method of producing MOS field-effect transistor comprises the following steps.
(a) formation of drain-source junction
(b) growth of gate oxide film
(c) wiring of electrodes In the present invention, it is not possible to use a high temperature of about 1,000° C. for diffusion of impurities, i.e., the high-temperature thermal diffusion is not available to the invention. Accordingly, the invention uses ion implantation and laser annealing. To grow the gate oxide film, the invention uses the plasma anodic oxidation.

Figure 1A:
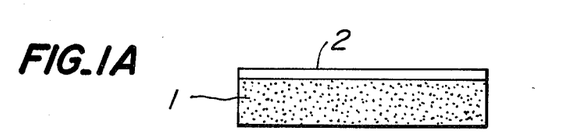
FIGS. 1A through 1G are a series of schematic sectional views showing different steps in an embodiment of the process of the present invention, which embodiment is to produce a MOS field-effect transistor.

FIGS. 1A through 1G show different steps of a method of producing a MOS field-effect transistor as an embodiment of the present invention. Referring to FIG. 1A, a semi-insulating silicon substrate 1 irradiated with thermal neutrons has a surface thereof covered with a silicon nitride film 2 for preventing the surface from contamination during laser annealing.

Figure 1B:
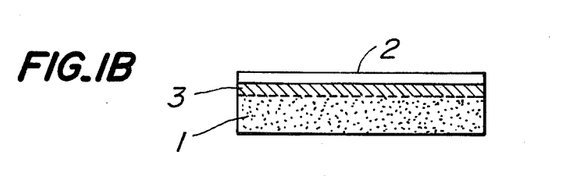

Referring to FIG. 1B, a surface layer 3 of about 1 μm in depth of the semi-insulating silicon substrate 1 is annealed by using a Q-switching ruby laser through the silicon nitride film 2 at a laser energy density of about 1 Joule/cm². In the illustrated embodiment, the silicon substrate before the neutron irradiation is of π type and has a resistivity of about 1.5 kΩcm, and the neutron irradiation by a dose of $1.6 \times 10^{18}$ n/cm² increases the resistivity of the substrate to more than 1 MΩcm. The laser annealing of the thus neutron-irradiated silicon substrate produces the semiconductive surface layer 3 of n type with a resistivity of about 2 Ωcm.

Figure 1C:
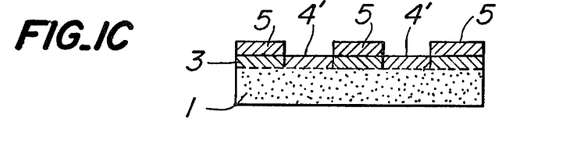

Referring to FIG. 1C, the silicon nitride film 2 is removed by hot phosphoric acid, and resist (AZ 1350) films 5 are applied to desired portions of the surface layer 3. The resist is removed by regular lithography from those portions 4' which are adjacent to portions to become source and drain areas of the MOS field-effect transistor.

Figure 1D:
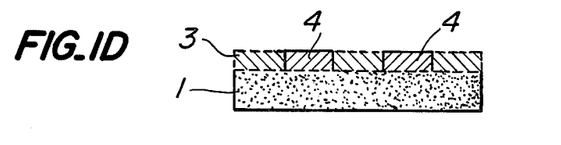

Referring to FIG. 1D, source and drain areas 4 are formed by implanting boron under the conditions of FIG. 1C by a dose of $10^{15}$/cm² with an accelerating voltage of 100 kV, and then the resist films 5 are removed. The impurity in the source and drain areas 4 is activated by laser annealing with an energy density of 0.4 Joule/cm², so as to produce n+ zones in the areas 4.

Figure 1E:
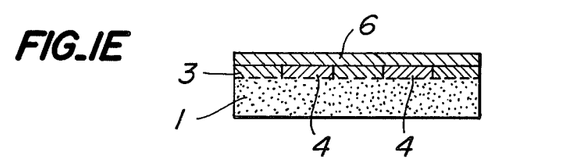
Figure 1F:
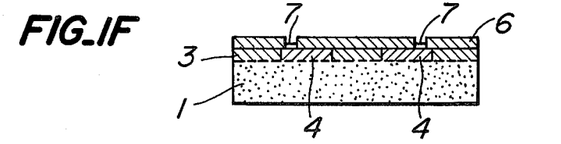
Figure 1G:
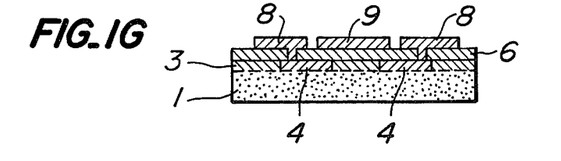

A silicon oxide film 6 is formed on the surface of the silicon substrate 1 by anodic oxidation while maintaining the silicon substrate 1 in an oxygen plasma at 500° C., as shown in FIG. 1E. Holes 7 are bored through the silicon oxide film 6 by lithography, to facilitate electric connections to the source and drain areas 4, as shown in FIG. 1F. Source and drain electrodes 8 and a gate electrode 9 are formed by evaporating aluminium on the silicon oxide film 6 and then patterning the evaporated aluminium layer through lithography again. Whereby, a MOS field-effect transistor is produced, as shown in FIG. 1G.

In the above-mentioned embodiment, the impurity in the surface layer 3 of the silicon substrate 1 is phosphorus produced by nuclear transformation of silicon in the substrate upon irradiation of thermal neutrons thereto. It is also possible to use pre-added suitable donors and acceptors, so as to produce a MOS field-effect transistor of N channel type.

As apparent from the foregoing embodiment, the present invention provides a method of producing a semiconductor device having a small capacitance relative to the ground by using a semi-insulating substrate, which semiconductor device is free from those lattice defects that are due to heteroepitaxy as in the case of the silicon on sapphire (SOS) structure, from long-time ion implantation and lattice defects as in the case of the separation by implanted oxygen (SIMOX) structure, and from contamination as in the case of adding gold (Au). Furthermore, the method of the invention can be applied both to elementary semiconductor devices such as a germanium semiconductor device and to compound semiconductor devices such as gallium arsenide (GaAs) or indium phosphide (InP) semiconductor devices to replace the conventional method of doping a large amount of impurities such as chromium in semiconductor to make it semi-insulating. Whereby, the invention provides semi-insulating substrates of high quality and improves the characteristics of compound semiconductor devices, such as those of gallium arsenide (GaAs).

Now, the invention will be described in further detail by referring to an example. The description will also refer to the formation of crystal lattice defects by irradiation of thermal neutrons and the change of insulating property by laser annealing.

Example

The description is divided into the following sections and subsections.
  I. Effects of annealing temperature on lattice defects and insulating properties of silicon substrate irradiated with thermal neutrons
    I-1 Sample preparation and measuring conditions
    I-2 Result of measurement
  II. Confirmation of extinction of lattice defects by laser annealing and trial preparation of silicon insulator (S-i) structure
    II-1 Effect of laser annealing
    II-2 Trial preparation of S-i structure
      II-2-1 Theoretical review
      II-22 Experiment III. Preparation of MOSFET having S-i structure made by low-temperature process
  III-1 Outline of low-temperature process used
  III-2 Characteristics of S-i MOSFET and analysis thereof
  III-3 Evaluation of insulation of the sample MOSFET made by low-temperature process
IV. Conclusion I. Effects of annealing temperature on lattice defects and insulating property of silicon substrate irradiated with thermal neutrons.

I-1 Sample preparation and measuring conditions

Table 1 shows sample to be irradiated with thermal neutrons, which samples were dislocation-free FZ silicon substrates of either 140 μm or 300 μm thickness. The irradiation of thermal neutrons was carried out under the conditions of Table 2 at Japan Nuclear Energy Center. After the irradiation, the samples were cooled for about three months. To prevent the sample surface contamination, some of the samples were protected by thermally oxidized films before irradiation. After irradiation, the samples were treated by hydrochloric acid, and the sample surfaces were etched by a thickness of about one μm by a mixed solution of hydrofluoric acid and nitric acid. Thermal annealing was carried out for about 20 minutes in an argon (Ar) atmosphere under the conditions as shown in Table 3.

TABLE 1
Properties of Silicon Substrate Before Thermal Neutron Irradiation

| Item | Description |
|---|---|
| Growth method | Floating zone method |
| Impurity | Boron |
| Resistivity | >1.5 kΩcm |
| Orientation | <111> |
| Thickness | 150 and 300 μm |

TABLE 2
Condition for Irradiation of Thermal Neutrons

| Item | Description |
|---|---|
| Thermal neutron source | JPR-3 reactor of J.A.E.I. |
| Thermal neutron flux | 2 × 10$^{13}$ n/cm$^2$.sec |
| Cd ratio | 15:1 |
| Dose | 4 × 10$^{17}$ n/cm$^2$ and 16 × 10$^{18}$ n/cm$^2$ |
| Cooling time | 3 months |
| Etching | by a mixture of HF and NHO$_3$ at a ratio of 1:10, for one minute |

TABLE 3
Thermal Annealing Conditions

| Item | Description |
|---|---|
| Furnace | Resistance-heated quartz reactor |
| Temperature | 200 to 1,000° C. |
| Amblent | Argon |
| Annealing step | 50° C. |
| Annealing time | 20 minutes |

TABLE 4
Conditions for ESR Measurement

| Item | Description |
|---|---|
| Microwave frequency | X band |
| Cavity | TE$_{011}$ |
| Temperature | 300° K. and 77° K. |
| Modulation width | 1 G |
| Modulation frequency | 100 kHz |
| Microwave power | 2 mW |
| Measuring object | dX/dH |
| Marker | Mn$^2$ in MgO |
| Sensitivity | 5 × 10$^{10}$ spin/G |

The lattice defects in the substrates were measured by the electron spin resonance (ESR) method. The ESR device used was of JESME type made by Nippon Denshi Co. Ltd. Measurements were taken at room temperature and at the temperature of liquid nitrogen. Other measuring conditions were as shown in Table 4. The g value was determined by the following equation.

$$hv = g\beta H \tag{3}$$

wherein,
  h: Planck's constant,
  x: frequency of microwave,
  β: Bohr magneton, and
  H: Strength of DC magnetic field.

The microwave frequency was determined by a frequency meter. The magnetic field was calibrated by using a standard DPPH sample with a known g$_o$ value.

I-2 Result of measurement

Figure 2:
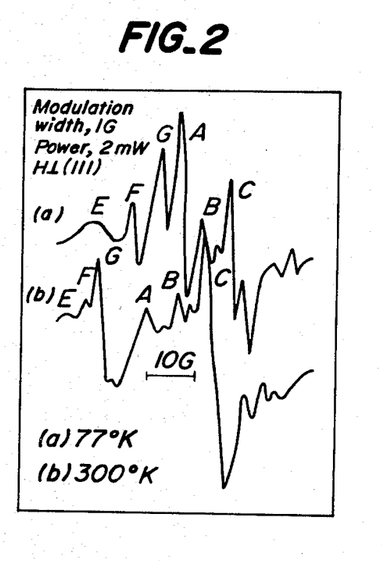
FIG. 2 is a graph showing the lattice defect characteristics of a thermal-neutron-irradiated silicon substrate, as determined by ESR signals.

FIG. 2 shows ESR signals thus measured. When the magnetic field was applied at right angles to the <111> plane, six peaks appeared in total. The g values of the six peaks are shown in Table 5. The peaks A, B, and C had g values of 2.012, 2.007, and 2.005, respectively, and were identified as those due to Si-P$_1$ center. According to Lee, such Si-P$_1$ center is formed of five silicon vacancies. The remaining peaks E, F, and G proved to be annealed at about 200° C., so that such peaks appeared to be due to another center. The inventors deduced that said other center might have been "divacany", because it was very similar to an Si-A$_2$ center produced by electron-ray irradiation. Similar peaks were measured at the temperature of liquid nitrogen.

TABLE 5
ESR Signal g values for Lattice Defects Produced by Thermal Neutron Irradiation
Magnetic field H being perpendicular to <111>plane

| Peak | Nisenoff and Fan | Present work | Center |
|---|---|---|---|
| A | 2.011 | 2.011 | Si—P$_1$ |
| B | 2.0075 | 2.008 | (Si—N) |
| C | 2.005 | 2.005 | |
| E | — | 2.022 | Si—A$_2$ |
| F | — | 2.020 | |
| G | — | 2.019 | |

Figure 3:
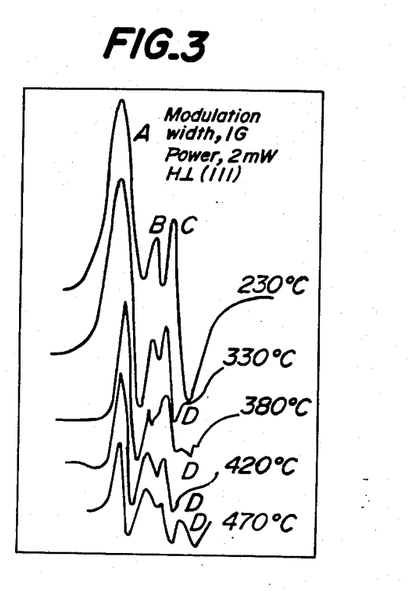
FIG. 3 is a graph showing the variation of ESR signals relating to the thermal-neutron-irradiated silicon substrate with the change of the annealing temperature thereof.
Figure 4:
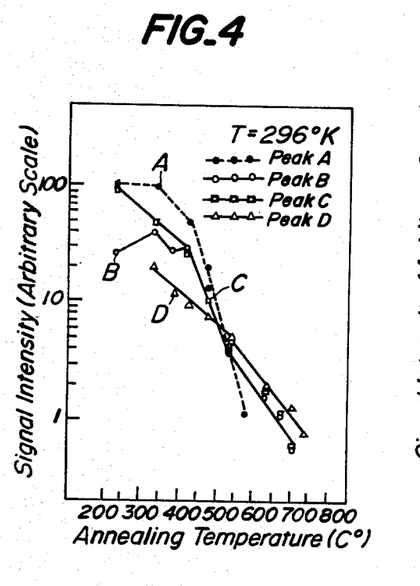
FIG. 4 is a graph showing the variation of the ESR signal intensity relating to the thermal-neutron-irradiated silicon substrate with the change of the temperature of heat treatment thereof.
Figure 5:
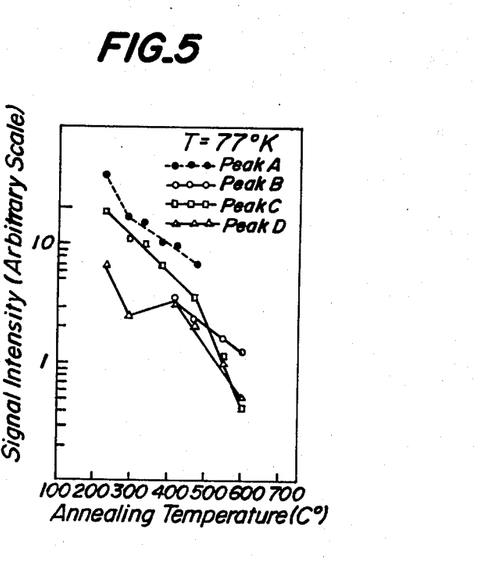
FIG. 5 is a graph showing the variation of the ESR signal intensity relating to the thermal-neutron-irradiated substrate with the change of the temperature of heat treatment thereof, as measured at the temperature of liquid nitrogen.
Figure 6:
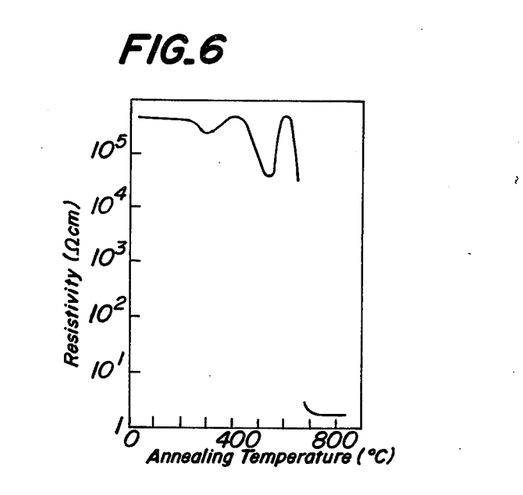
FIG. 6 is a graph showing the relationship between the resistivity of the thermal-neutron-irradiated silicon substrate (with a thermal neutron dose of $3.8 \times 10^{18}$ n/cm$^2$) and the temperature of heat treatment thereof.

FIG. 3 shows the variation of the peaks A, B, and C of the ESR signals from the silicon substrate irradiated with thermal neutrons depending on the annealing temperature. As can be seen from FIG. 3, a new peak D hidden by the peak C appeared clearly after annealing at 400° C. Peak-to-peak values of the ESR signals from the thermal-neutron-irradiated silicon substrates were measured at the room temperature after annealing at different temperatures, and FIG. 4 shows the relationship between the variation of such peak-to-peak values and the annealing temperature. The peak A disappeared after annealing at about 600° C., but the peaks B, C, and D remained at low levels even after annealing at 700° C. Similar experiments and measurements were carried out at the temperature of liquid nitrogen, and FIG. 5 shows the relationship between the variation of the intensity of the ESR signals and the heat treating temperature. The figure shows that the peak A disappeared after annealing at 600° C., but the peaks B, C, and D remained, as shown in the figure. FIG. 6 shows the relationship between the resistivity of thermal-neutron-irradiated silicon substrate and the heat treating temperature thereof (the dose thermal neutron irradiation was $3.8 \times 10^{18}$ n/cm$^2$).

As can be seen from FIG. 6, the resistivity of the sample rapidly dropped after being treated at 600° C. or higher, but the samples kept high resistivity thereof after being treated at temperatures below 600° C. Although this appears contradictory to the monotonous phenomenon of the lattice defect density of FIG. 4 and FIG. 5, the density of impurities added was less than about $10^{15}$ despite that the density of the spin produced after irradiation under the aforesaid conditions was about $10^{16}$/cm$^3$, so that even when the intensity of the ESR signals was reduced by a factor of about 10, the density of the lattice defects was still large enough to keep the substrate semi-insulating.

Figure 7:
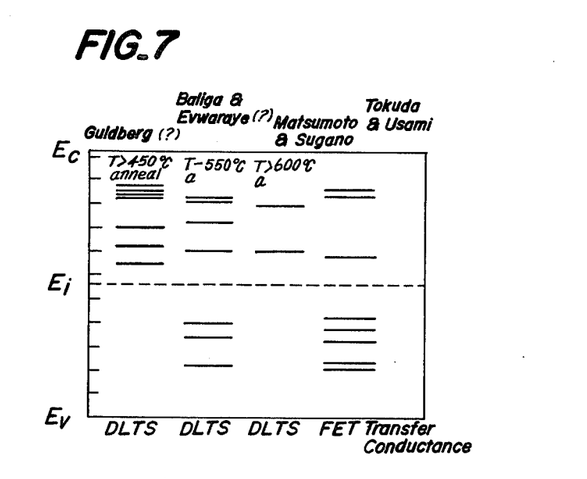
FIG. 7 is a diagram showing the energy levels of lattice defects generated by irradiation of thermal neutrons.

FIG. 7 shows the energy levels of the lattice defects generated by irradiation with thermal neutrons, which were determined by measuring the energy levels of such lattice defects by the DLTS method. As can be seen from FIG. 7, a number of deep levels were generated in the silicon substrate. The Si-P$_1$ center as measured by the ESR method might have been the cause of the levels thus determined.

In short, the irradiation with thermal neutrons generates a number of lattice defects in the silicon substrate, and the inventors assume that the atomic structures of such defects may be complicated silicon vacancies. The trap levels thereof make the substrate semi-insulating, but almost all of the trap levels are annealed at 600° C. or higher. Accordingly, when a silicon semiconductor device is to be produced by using such a semi-insulating silicon substrate, it is necessary to keep the process temperature below 600° C.

II. Confirmation of extinction of lattice defects by laser annealing and trial preparation of silicon insulator (S-i) structure II-1 Effect of laser annealing The thermal-neutron-irradiated silicon substrate has point defects generated therein but maintains the crystal properties thereof, so that it does not mean much to investigate the change of the crystal structure after the irradiation with laser beam. In this case, both the electric properties and the behaviour of point defects must be checked, but it is very difficult from the standpoint of ESR measuring sensitivity to measure the electric properties and the behaviour of the point defects of a very thin layer being annealed which layer is formed by adding impurities at a low density of about $10^{15}$/cm$^3$. Thus, a YAG (yttrium-aluminium-garnet) laser having a long light penetrating length (wavelength $\lambda = 1.06$ $\mu$m, $\alpha \cong 10$ cm$^1$) was selected to check the effects of the laser annealing.

Figure 8:
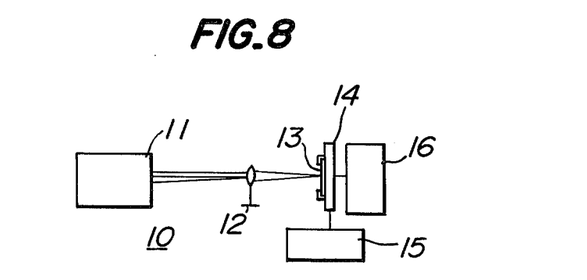
FIG. 8 is a block diagram of a laser annealing apparatus using a CW Nd YAG laser.

FIG. 8 shows a block diagram of the laser annealing apparatus 10 used in the experiments. A laser device 11 of the apparatus 10 was an SL 113 type Nd-YAG (neodymium-yttrium-aluminium-garnet) laser made by Nippon Electric Company, and the rated output of the laser device 11 was about 10 W with CW oscillation. A 100 mm single lens 12 was used to focus the laser beam at the surface of a sample 13 disposed at the focal plane of the lens. An x-y dual axes mechanical stage 14 carried the sample 13, and an x-axis scanning unit 15 and a y-axis scanning unit 16 drove the stage 14 horizontally and vertically to anneal a square area of about 1 cm by 1 cm size. The laser beam had a diameter of about 40 $\mu$m at the focal plane, and the scanning speed was 10 mm/sec. To anneal the area homogeneously, the irradiating laser beam was overlapped about 30%. To measure the change of resistivity in response to the laser annealing, the sample was prepared by a process as shown in FIGS. 9A through 9E.

Figure 9A:
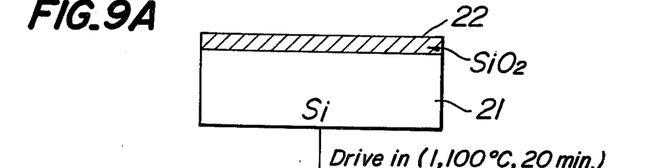
FIGS. 9A through 9E are schematic sectional views showing different steps of a process of producing a sample for checking the effect of annealing by the Nd YAG laser.
Figure 9B:
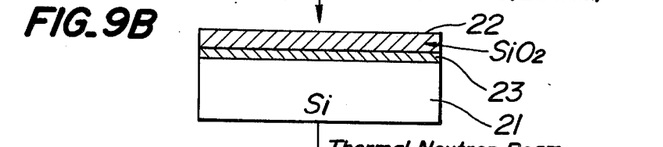
Figure 9C:
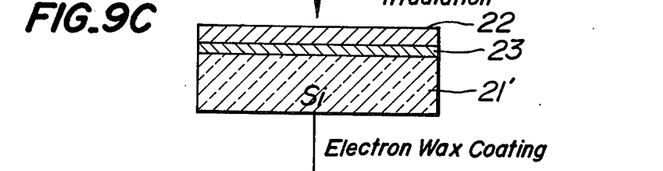
Figure 9D:
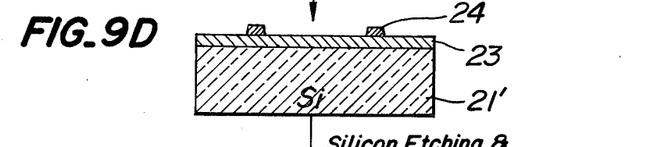

Referring to FIG. 9A, an oxide layer 22 containing phosphorus was formed on the surface of a silicon substrate 21. An n$^+$ layer 23 of FIG. 9B was formed between the silicon substrate 21 and the oxide layer 22 by heating the substrate with the oxide layer at 1,100° C. for 20 minutes. As shown in FIG. 9C, thermal neutron beam was irradiated onto the sample so as to generate lattice defects from the surface to the inside of the silicon substrate 21. After removing the oxide layer 22, electron wax coatings 24 were applied to two portions of the n$^+$ layer 23, as shown in FIG. 9D.

Figure 9E:
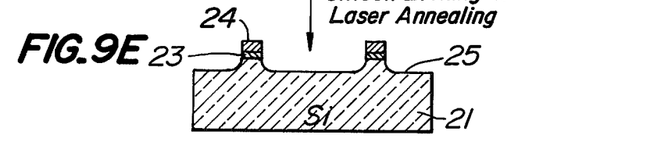

Then, the n$^+$ layer 23 was etched, so as to form the etched portions 25 where the n$^+$ layer 23 is completely removed, whereby the sample 13 was produced. The resistivity of the sample 13 was measured while annealing it by laser beams from the Nd YAG laser device 11, so that the change of the resistivity with the progress of the laser annealing was checked to confirm the effectiveness of the laser annealing.

Figure 10:
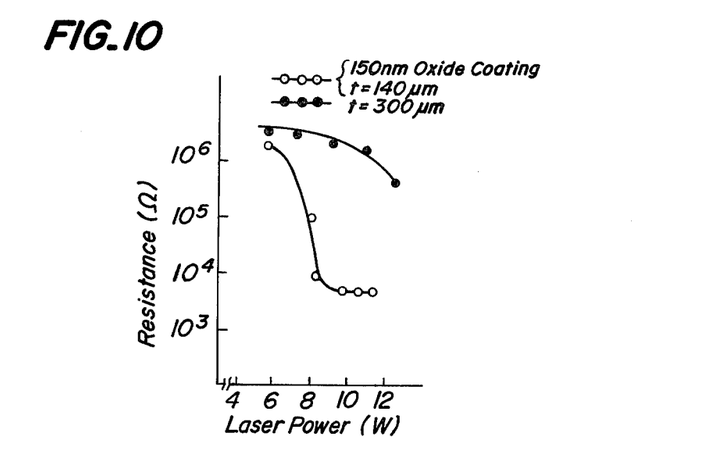
FIG. 10 is a graph showing the variation of the resistance of the sample with the change of the power of the Nd YAG laser for annealing thereof.
Figure 11:
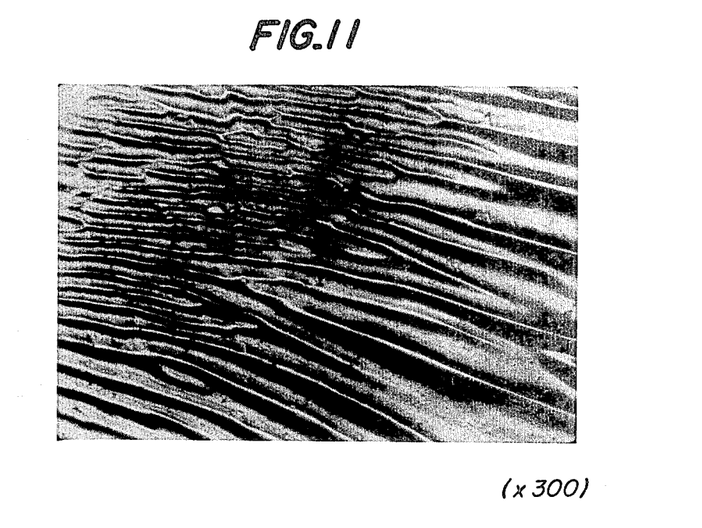
FIG. 11 is a microscopic photograph (with a magnification of 300 times) of the conditions of a surface melted by CW YAG laser beam.

The result of the resistivity measurement is shown in FIG. 10. In the case of the thin sample of 140 $\mu$m thickness with a silicon oxide (SiO$_2$) protective layer of about 1,000 Å thickness, effective annealing was achieved at a comparatively low energy level, and the electric properties of the sample recovered at about 8 W of the laser power. When the laser power increased to about 10 W, the surface of the sample was melted as shown in FIG. 11. FIG. 11 shows the conditions of the molten surface of the silicon substrate (at a magnification of 300 times), which was melted by the CW YAG laser device. In the case of thick samples, the annealing at the same energy level of the laser beam did not cause sufficient recovery. Such difference can be explained as follows; namely, calculation of heat conduction shows that the top surface temperature of the silicon substrate being irradiated with laser beam heavily depends on the temperature of the bottom surface of the substrate, and when the substrate is thin, the laser beam penetrates to the bottom surface to raise the temperature of the bottom surface, whereby the temperature of the top surface is also raised.

Figure 12:
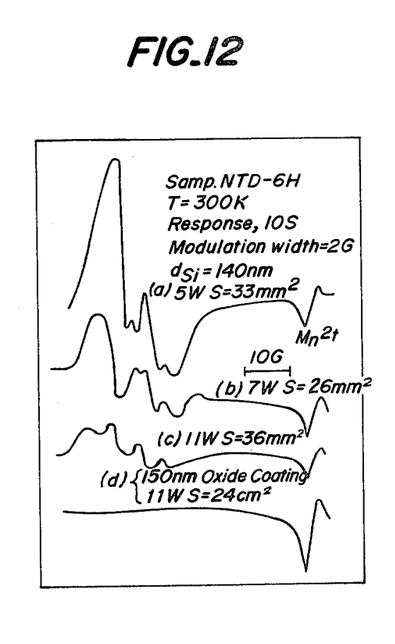
FIG. 12 is a graph showing the process of extinction of point defects in the thermal-neutron-irradiated silicon substrate by the Nd YAG laser annealing.

Behaviour of the point defects was checked by the ESR method. FIG. 12 shows the manner in which the lattice defects of the thermal-neutron-irradiated silicon substrate become extinct by the laser annealing using the Nd YAG laser device. As can be seen from the checked result of FIG. 12, the peaks due to the Si-A$_2$ center were annealed at a low power, but those due to the Si-P$_1$ center were only reduced even when the laser energy was increased reasonably, and only the extreme annealing accompanied with the melting of the silicon substrate surface could completely extinguish them.

II-2 Trial preparation of S-i structure

II-2-1 Theoretical review

In view of the foregoing test result, the extinction or annealing of the lattice defects of the thermal-neutron-irradiated silicon substrate by laser irradiation can be explained by the temperature rise of the silicon substrate by the laser irradiation. Accordingly, to produce a silicon insulator (S-i) structure for practical use, it is necessary to restrict the temperature rise of the substrate to the close proximity of the surface thereof when the substrate is irradiated with the laser beam.

The temperature rise of the surface by the laser beam irradiation can be calculated by the heat conduction equation. In the case of laser beam from a Q-switching ruby laser ($\lambda = 0.694$ µm, $\alpha \cong 2 \times 10^3$/cm), the light penetrating length is short, so that such laser beam seems practicable. In fact, since the light penetrating length is sufficiently short as compared with the diameter of the laser beam, the heat conduction equation can be simplified to that of one variable, as shown in the following equation (4).

$$\frac{\partial}{\partial x}\left(-K_f(T)\frac{\partial T}{\partial x}\right) + C_f(T)\frac{\partial T}{\partial t} P_f(x, t) \quad (4)$$

with boundary conditions of $$K_S \frac{\partial T}{\partial x} x_B - K_L \frac{\partial T}{\partial x} x_B = L \frac{dx_B}{dt} \quad (5)$$

Wherein, $K_S$ is a solid heat conductivity, $K_L$ is a liquid heat conductivity, C is a specific heat, L is a latent heat, and $x_B$ is the coordinate of a liquid-solid phase boundary.

The right-hand side term of the equation (4) represents a heat source comprised of the input energy from the laser device, which is given by $$P_f(x, t) = \frac{\alpha_j E(1 - R_j)}{\sqrt{\pi}\Gamma} \exp(-\alpha_j x)\exp\left(-\frac{t}{\Gamma}\right)^2$$

Wherein, $R_j$ is a light reflection coefficient, $\alpha_j$ is an absorption coefficient, E is the input energy per unit area from the laser source, and the laser beam is assumed to have a Gaussian distribution with a half power width of $2(\ln 2)^{1/2}\Gamma$.

Figure 13:
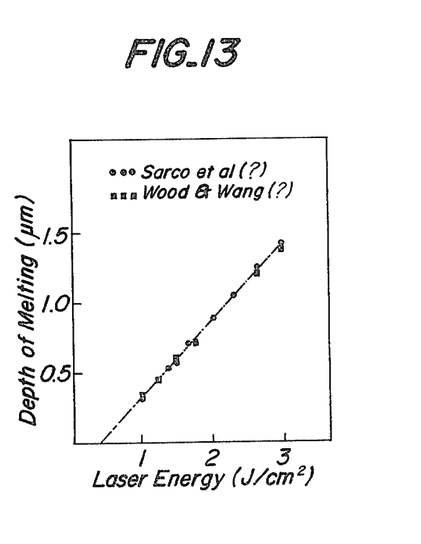
FIG. 13 is a graph showing the relationship between the depth of molten surface melted by irradiation of laser beam from a Q-switching ruby laser and the laser energy.
Figure 14:
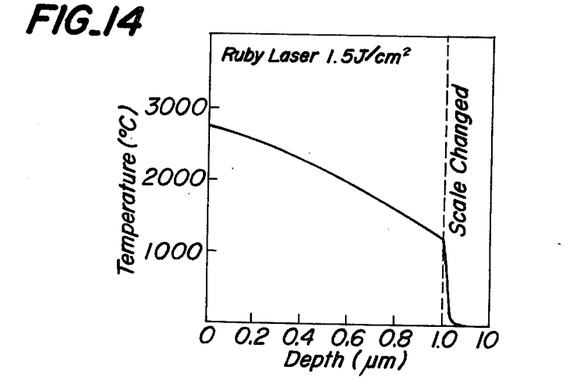
FIG. 14 is a graph showing temperature distribution in the substrate surface which is irradiated with laser beam from a Q-switching ruby laser.

The result of the calculation is shown in FIG. 13 and FIG. 14. FIG. 13 shows the relationship between the laser energy density and the depth of molten surface layer melted by irradiation from a Q-switching ruby laser, while FIG. 14 shows the temperature distribution in the depth direction. In view of the data of the two figures, it may be assumed that a surface layer of about 1 µm thickness can be annealed by setting the energy density of the Q-switching laser at 1 to 2 J/cm².

II-2-2 Experiment

To confirm the aforesaid result of the theoretical calculation, a test was carried out by preparing an S-i structure by using a Q-switching ruby laser. The Q-switching laser used was of Nippon Electric Company type SL 2008 with a wavelength of 0.694 µm and an output of 0.85 J/pulse. To control the energy density of the irradiation, the area of the irradiation was regulated by using the combination of a concave lens with a focal length of 118 mm and a convex lens with a focal length of 100 mm.

To measure the depth of the surface layer which was annealed, the variation of the resistance value of the surface layer was measured by etching through a process as shown in FIGS. 15A through 15F.

Figure 15A:
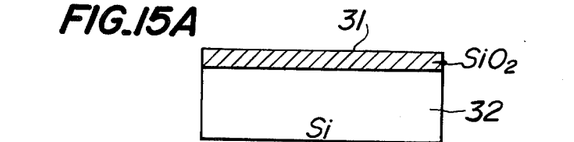
FIGS. 15A through 15F are schematic sectional views showing different steps of a process for measuring the depth of annealing by the laser beam from the Q-switching ruby laser.
Figure 15B:
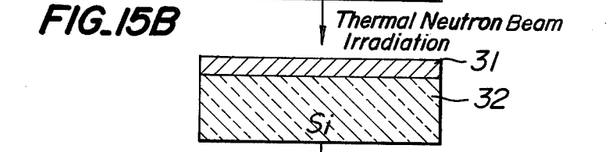
Figure 15C:
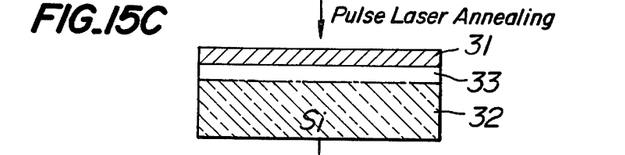
Figure 15D:
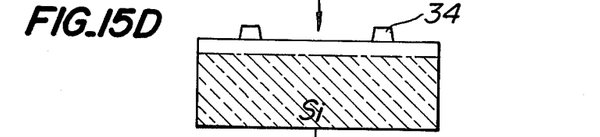
Figure 15E:
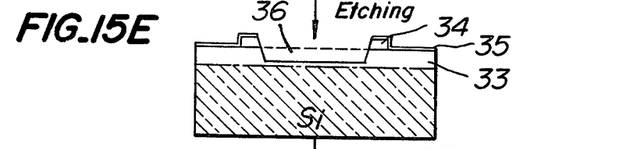
Figure 15F:
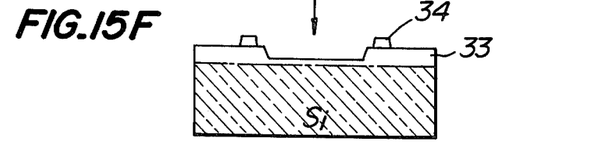
Figure 16:
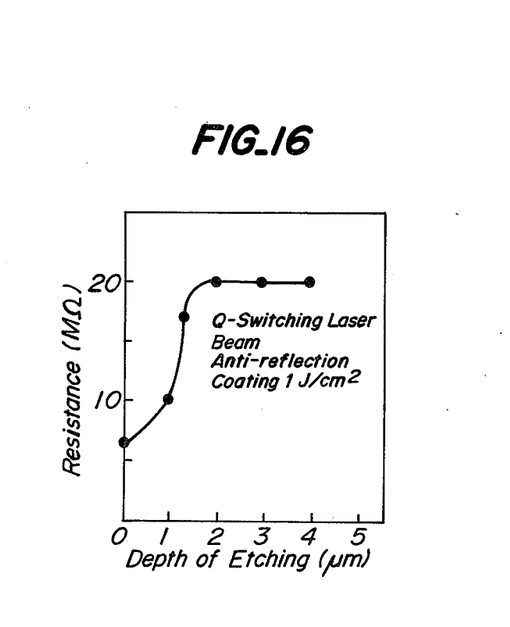
FIG. 16 is a graph showing the relationship between the surface resistance being measured and the etching depth.

More specifically, a silicon substrate 32 having a silicon oxide (SiO₂) film 31 on the surface thereof as shown in FIG. 15A was irradiated with thermal neutron beams, so that lattice defects were produced throughout the silicon substrate 32 to make it semi-insulating as shown in FIG. 15B. The surface of the silicon substrate 32 was annealed by irradiating it with laser beam pulses, so that an activated layer 33 was formed at the surface portion of the silicon substrate 32 adjacent the silicon oxide film 31, as shown in FIG. 15C. The activated layer 33 was exposed by removing the silicon oxide film 31 and two ohmic contacts 34 were formed on the activated layer 33, as shown in FIG. 15D. Electron wax coating 35 was provided on the surface of the activated layer 33 except the area between the two ohmic contacts 34, and the intercontact area 36 between the two contacts 34 was etched as shown in FIG. 15E. Then, the entire electron wax was removed as shown in FIG. 15F, and the measurement was taken under the conditions of FIG. 15F. When the surface layer was just etched away, the resistance value across the measuring terminals became constant, which constant resistance value represented the resistance of the semi-insulating substrate. FIG. 16 is a graph showing the relationship between the measured resistance value MΩ between the two terminals 34 and the depth µm of the etching of the activated layer 33. As can be seen from FIG. 16, when a thermal-neutron-irradiated silicon substrate protected by an about 0.1 µm thick silicon oxide film was irradiated with laser beam at an energy density of about 1 J/cm², a surface layer of about 1 µm thickness proved to be annealed. The result of the experiment well coincided with the theoretical value within the experimental error.

Figure 17:
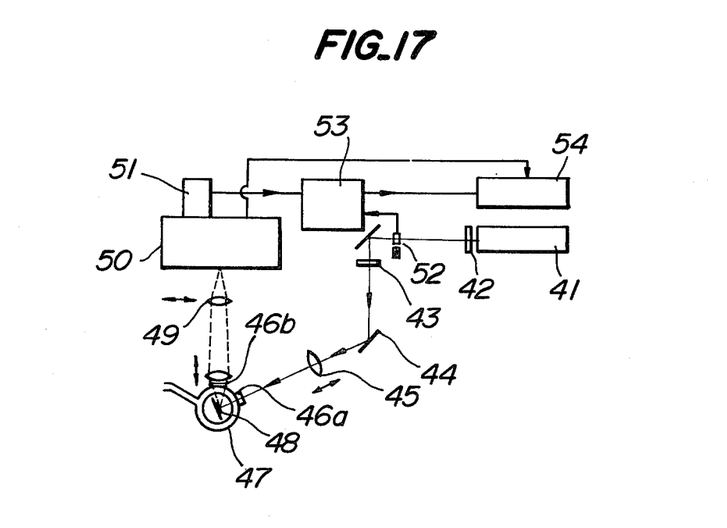
FIG. 17 is a block diagram of the circuit of a photo-luminescence measuring apparatus.
Figure 18:
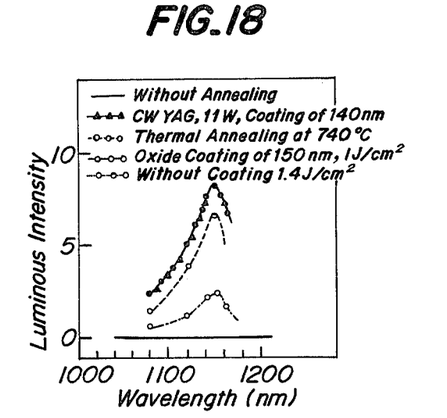
FIG. 18 is a photo-luminescence spectrum diagram of a laser-annealed surface.

To optically check the difference of the characteristics of the surface activated layer due to the different annealing conditions, the intensity of photo-luminescence of such layer was measured by using a measuring device as shown in FIG. 17. FIG. 18 shows the result of the measurement. As can be seen from FIG. 18, no photo-luminescence was measured at the room temperature in the case of a sample as irradiated with thermal neutrons, and the photo-luminescence was measured only after annealing the sample with laser beam. It was noted that the photo-luminescence was doubled with the protective film. The reason for it appeared to be that the protective film prevented oxygen and nitrogen from entering into the layer being annealed.

Referring to FIG. 17, the structure and function of the photo-luminescence measuring device used will be described now. The beam from an argon laser 41 is thoroughly monochromized by two stages of filters 42 and 43 and directed and focussed by the reflectors 44 and the lens 45 so as to become incident to a sample 48 through a window 46a of a cryostat 47 carrying the sample 48. Upon irradiation with the laser beam, the sample 48 becomes luminous to emit light toward a monochromatic meter 50 through another window 46b of the cryostat 47 and a lens system 49. Signal from the monochromatic meter 50 is amplified by a photomultiplier 51, and electric signals from the photomultiplier 51 forming the output signals of the photo-luminescence measuring device are applied to a lock-in amplifier 53. A chopper 52 is disposed between the filters 42 and 43, so as to chop the laser beam from the argon laser 41 after passing the filter 42 for applying a reference signal to the lock-in amplifier 53. The lock-in amplifier 53 converts the AC electric signals from the photomultiplier 51 into DC voltages while keeping in synchronism with the reference signal from the chopper, and the DC voltages from the lock-in amplifier 53 are recorded by a recorder 54.

III. Preparation of MOSFET having S-i structure made by low-temperature process

III-1 Outline of low-temperature process used

In the preceding section II, preparation of the silicon insulator (S-i) structure has been described, and as mentioned in section I, the temperature of any process to produce a device from such S-i structure must be maintained below 600° C. To evaluate the activated layer formed by annealing and to analyze the entire process of producing a device by using such S-i structure and activated layers, a simple sample of metal oxide silicon field-effect transistor (MOSFET) was prepared, and the characteristics of such sample were measured and analyzed.

Steps necessary for making a MOSFET are
(i) formation of a PN junction by adding impurity,
(ii) growth of a gate oxide film,
(iii) wiring of electrodes, and
(iv) surface stabilization.

In the case of the S-i structure, the conventional high-temperature thermal diffusion process (at a temperature higher than 1,000° C.) could not be used, so that suitable impurity was added by ion implantation, and the impurity thus added was activated by the laser annealing. To grow the gate oxide film, the high-temperature thermal oxidation (at a temperature higher than 800° C.) could not be used, but low-temperature processes such as plasma chemical vapour deposition (CVD) sputtering, and anodic oxidation were available. Silicon oxide ($SiO_2$) films grown by the plasma CVD and sputtering did not necessarily have good stoichiometry, and plasma anodic oxidation through a dry process was selected. A protective film for the silicon surface was formed by the plasma CVD.

III-2 Characteristics of S-i MOSFET and analysis thereof

Figure 19:
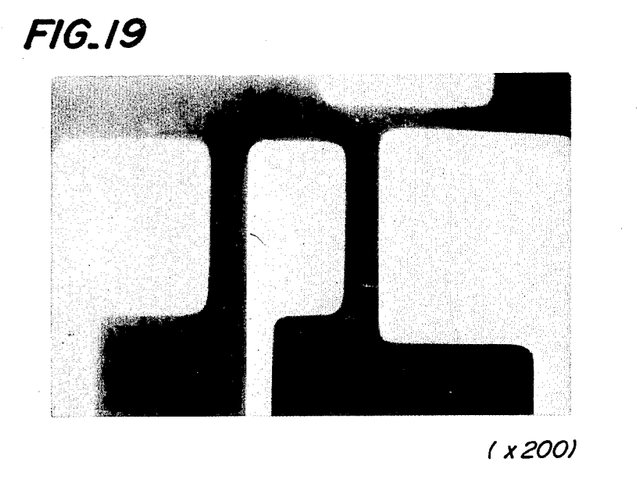
FIG. 19 is a sectional view showing the pattern of a MOS field-effect transistor as an embodiment of the invention.
Figure 20:
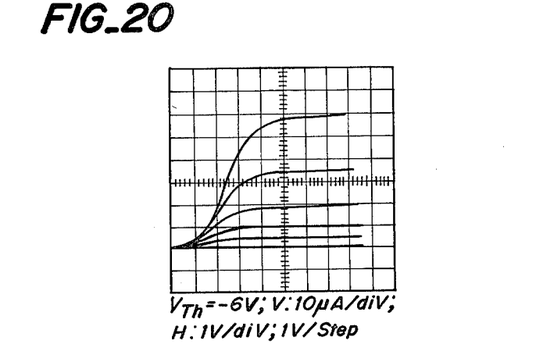
FIG. 20 is a DC characteristics diagram of a MOSFET prepared by a low-temperature process, wherein $V_{th} \simeq -6$ V, the vertical scale is 10 $\mu$A/div, the horizontal scale is 1 V/div, and the measurement is at 1 V/step.
Figure 21:
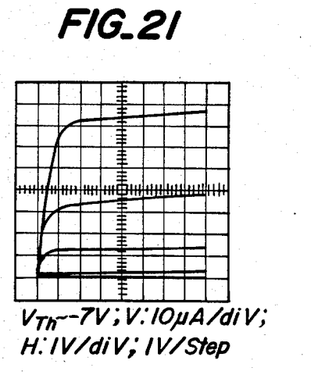
FIG. 21 is a DC characteristics diagram of a MOSFET prepared by a high-temperature process, wherein $V_{th} \simeq -7$ V, the vertical scale is 10 $\mu$A/div, the horizontal scale is 1 V/div, and the measurement is at 1 V/step.

FIG. 19 shows the pattern of the MOSFET sample thus prepared. The MOSFET had a gate length of about 50 μm and a gate width of 200 μm. FIG. 20 shows the DC characteristics of the MOSFET. To analyze such characteristics, a MOSFET of the identical dimensions was prepared by a high-temperature process under the conditions in which the lattice defects in the substrate were completely extinguished. The high-temperature process included thermal oxidation at 1,100° C. and thermal diffusion as 1,100° C. FIG. 21 shows the DC characteristics of the MOSFET prepared by the high-temperature process at 1,100° C. For high drain voltages, the MOSFET's of FIGS. 20 and 21 have substantially similar characteristics, but at low drain voltages, the S-i MOSFET prepared by the low-temperature process has slow rises.

Possible reasons for the slow rises of the MOSFET prepared by the low-temperature process seem to be
(a) interfacial characteristics of the film made by plasma anodic oxidation,
(b) residual lattice defects in the activated layer, and
(c) residual lattice defects in the junctional portion of the PN junction.

Figure 22:
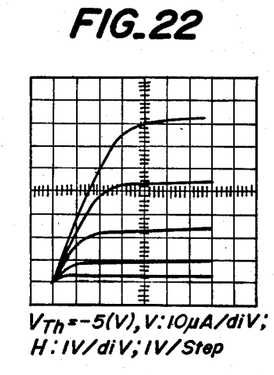
FIG. 22 is a DC characteristics diagram of a silicon MOSFET prepared by using a substrate not irradiated with thermal neutron beams and a gate oxide film formed through a plasma anodic oxidation process, wherein $V_{th} \simeq -5$ V, the vertical scale is 10 $\mu$A/div, the horizontal scale is 1 V/div, and the measurement is at 1 V/step.

To analyze the aforesaid reason (a), a MOSFET of the identical dimensions to those of the aforesaid sample was prepared by using a silicon wafer without irradiation with thermal neutrons, which MOSFET had source and drain electrodes made by thermal diffusion and a gate oxide film made by plasma anodic oxidation. FIG. 22 shows the DC characteristics of the MOSFET thus prepared by the silicon wafer without neutron irradiation. Since FIG. 22 showed good rises at low drain voltages, it was concluded that the interfacial characteristics of the film made by plasma anodic oxidation was not the cause of the aforesaid slow rises of the sample MOSFET. Thus, the reasons for the slow rises of the DC characteristics of the S-i MOSFET made by the low-temperature process including the heating at less than 600° C. are considered to be residual lattice defects both in the activated layer and in the junctional portion of the PN junction. The presence of the residual lattice defects may be due to the fact that the short-time heating and quick cooling during the laser annealing tend to generate some new lattice defects. Besides, there is a possibility that a part of the lattice defects produced either by the thermal neutron irradiation or by the ion implantation remain even after the short-time heating. The problem of the residual lattice defects will be solved separately in the future.

Figure 23:
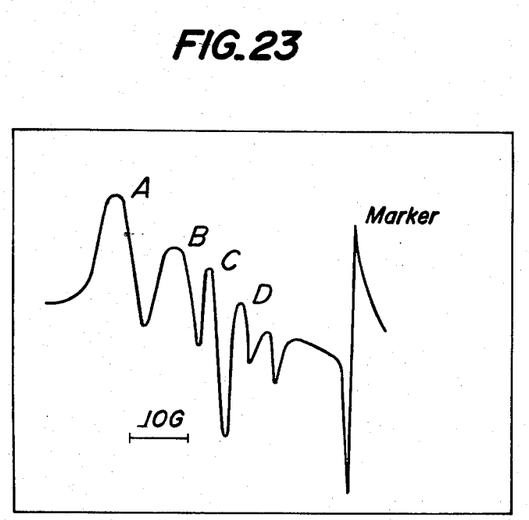
FIG. 23 is a graph showing the characteristics of ESR signals due to lattice defects in a thermal-neutron-irradiated silicon substrate after plasma anodic oxidation (at an oxidizing temperature of about 500° C.).

III-3 Evaluation of insulation of the sample MOSFET made by low-temperature process During the process of producing the sample MOSFET, the maximum temperature was kept below 500° C. except the laser annealing. After the oxidation, the lattice defects in the substrate were measured again by the ESR method. Referring to FIG. 23 showing the result of such measurement, the intensity of the ESR signals proved to be reduced to about one tenth of that before the oxidation. As described above, the density of the lattice defects was about $10^{15}$ spin/cm$^3$, so that the semi-insulating characteristics of the silicon substrate were maintained. The resistivity of the substrate was confirmed to be about $10^5$ Ωcm by measurement.

IV. Conclusion

As described in the foregoing, according to the present invention, a semi-insulating semiconductor substrate is provided by irradiation with radioactive ray such as thermal neutron beam, and high-frequency devices and high-speed logic elements can be produced by using such semi-insulating semiconductor substrate. For instance, a semi-insulating silicon substrate is formed by irradiating a regular silicon substrate with thermal neutron beam, and a silicon insulator (S-i) structure is produced by annealing the surface of the semi-insulating silicon substrate through laser annealing, whereby a silicon device can be produced by a low-temperature process. Accordingly, the novel semi-insulating semiconductor structure proved to be useful.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of producing a semiconductor device, comprising steps of irradiating a semiconductor substrate with radiation so as to generate crystal lattice defects therein for making the entire semiconductor substrate semi-insulating providing a semiconductive surface layer portion on the surface of said semi-insulating substrate, and providing a semiconductor device in this semiconductive surface layer portion.

2. A method as set forth in claim 1, wherein said semiconductor substrate is made of one of elementary semiconductors and compound semiconductors.

3. A method as set forth in claim 1, wherein said semiconductor substrate is made of material selected from the group consisting of silicon, germanium, gallium arsenide (GaAs), and indium phosphide (InP).

4. A method as set forth in claim 1, wherein said radiation is selected from the group consisting of thermal neutron beam, high-speed neutron beam, α-ray, β-ray, γ-ray, and electron beam.

5. A method of producing a semiconductor device, comprising steps of irradiating a silicon substrate with a thermal neutron beam so as to cause both generation of crystal lattice defects for making the entire silicon substrate semi-insulating and nuclear transformation of a part of the silicon into phosphorus, annealing the surface portion of said irradiated silicon substrate so as to make only said surface portion semiconductive, and providing a semiconductor device on this semiconductor device on this semiconductive surface.

6. A method as set forth in claim 5, wherein said annealing is effected by irradiating said semi-insulating silicon substrate with one of laser beam, electron beam, and ion beam.

7. A method as set forth in claim 5, wherein said irradiation of said silicon substrate with said thermal neutron beam is at a dose of not less than $10^{17}$ n/cm$^2$.

8. A method of producing a semiconductor device, comprising steps of irradiating a high purity silicon member with neutron beam so as to introduce deep trap levels in the silicon substrate for making it semi-insulating, depositing a semiconductor film on said semi-insulating silicon substrate, and fabricating a semiconductor device on said semiconductor film.

9. A method as set forth in claim 8, wherein said deposition of the semiconductor film is effected by a process selected from the group consisting of vacuum evaporation, sputtering, chemical vapour deposition, molecular beam deposition, and plasma deposition.

10. A method of producing a metal oxide silicon field-effect transistor, comprising steps of irradiating a high purity silicon substrate with a thermal neutron beam so as to make the substrate semi-insulating, annealing only a surface portion of said semi-insulating silicon substrate by irradiation with a laser beam, and providing the metal oxide silicon field-effect transistor in said surface portion.

* * * * *